US009034744B2

(12) United States Patent
Richter et al.

(10) Patent No.: US 9,034,744 B2
(45) Date of Patent: May 19, 2015

(54) REPLACEMENT GATE APPROACH FOR HIGH-K METAL GATE STACKS BY AVOIDING A POLISHING PROCESS FOR EXPOSING THE PLACEHOLDER MATERIAL

(75) Inventors: Ralf Richter, Dresden (DE); Jens Heinrich, Wachau (DE); Andy Wei, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 191 days.

(21) Appl. No.: 12/942,200

(22) Filed: Nov. 9, 2010

(65) Prior Publication Data

US 2011/0244670 A1    Oct. 6, 2011

(30) Foreign Application Priority Data

Mar. 30, 2010   (DE) .......................... 10 2010 003 451

(51) Int. Cl.
| | |
|---|---|
| H01L 29/772 | (2006.01) |
| H01L 21/8238 | (2006.01) |
| H01L 21/768 | (2006.01) |
| H01L 29/66 | (2006.01) |
| H01L 29/78 | (2006.01) |

(52) U.S. Cl.
CPC .. *H01L 21/823842* (2013.01); *H01L 21/76819* (2013.01); *H01L 21/823807* (2013.01); *H01L 29/66545* (2013.01); *H01L 29/66583* (2013.01); *H01L 29/7833* (2013.01); *H01L 29/7843* (2013.01)

(58) Field of Classification Search
CPC ................... H01L 29/66545; H01L 29/66871; H01L 21/823842

USPC ................. 438/167, 169, 183, 197, 199, 300; 257/368, 369
See application file for complete search history.

(56) References Cited

U.S. PATENT DOCUMENTS

| | | | | |
|---|---|---|---|---|
| 6,445,047 | B1* | 9/2002 | Yamada et al. ................ | 257/391 |
| 6,767,814 | B2* | 7/2004 | Kwon et al. .................. | 438/592 |
| 7,479,684 | B2 | 1/2009 | Guha et al. | |
| 7,622,344 | B2* | 11/2009 | Liang et al. ................... | 438/222 |
| 7,939,392 | B2* | 5/2011 | Chung et al. .................. | 438/183 |

(Continued)

FOREIGN PATENT DOCUMENTS

| | | |
|---|---|---|
| WO | 0227799 A2 | 4/2002 |
| WO | 2006020158 A2 | 2/2006 |
| WO | 2006076991 A2 | 7/2006 |

OTHER PUBLICATIONS

Wolf, S. and Tauber, R. N., Silicon Processing for the VLSI Era vol. 1 Process Technology 2nd Edition, Lattice Press 2000, p. 742, 743, 767, 768.*

(Continued)

*Primary Examiner* — Fernando L Toledo
*Assistant Examiner* — Bryan Junge
(74) *Attorney, Agent, or Firm* — Amerson Law Firm, PLLC (57) ABSTRACT

In a replacement gate approach, the exposure of the placeholder material of the gate electrode structures may be accomplished on the basis of an etch process, thereby avoiding the introduction of process-related non-uniformities, which are typically associated with a complex polishing process for exposing the top surface of the placeholder material. In some illustrative embodiments, the placeholder material may be exposed by an etch process based on a sacrificial mask material.

21 Claims, 8 Drawing Sheets

(56) References Cited

U.S. PATENT DOCUMENTS

| | | | |
|---|---|---|---|
| 7,977,181 B2* | 7/2011 | Lai et al. ..................... 438/199 |
| 2005/0282341 A1 | 12/2005 | Park et al. |
| 2008/0087966 A1* | 4/2008 | Tai et al. ..................... 257/369 |
| 2008/0293249 A1* | 11/2008 | Cho et al. ..................... 438/703 |
| 2009/0039433 A1* | 2/2009 | Yang et al. ..................... 257/365 |
| 2010/0052074 A1* | 3/2010 | Lin et al. ..................... 257/407 |
| 2010/0059833 A1* | 3/2010 | Yu et al. ..................... 257/410 |

OTHER PUBLICATIONS

Translation of Official Communication from German Patent Application No. 10 2010 003 451.7 dated Nov. 3, 2010.

* cited by examiner

REPLACEMENT GATE APPROACH FOR HIGH-K METAL GATE STACKS BY AVOIDING A POLISHING PROCESS FOR EXPOSING THE PLACEHOLDER MATERIAL

BACKGROUND OF THE INVENTION

1. Field of the Invention

Generally, the present disclosure relates to sophisticated integrated circuits including transistor elements comprising gate structures formed on the basis of a high-k gate dielectric material and a metal-containing electrode material.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, CMOS technology is currently one of the most promising approaches due to the superior characteristics in view of operating speed and/or power consumption and/or cost efficiency. During the fabrication of complex integrated circuits using, for instance, CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, on the distance between the source and drain regions, which is also referred to as channel length. Hence, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity, is a dominant design criterion for accomplishing an increase in the operating speed of the integrated circuits.

Presently, the vast majority of integrated circuits are based on silicon due to the substantially unlimited availability, the well-understood characteristics of silicon and related materials and processes and the experience gathered during the last 50 years. Therefore, silicon will likely remain the material of choice in the near future for circuits designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes as are required, for example, for anneal cycles to activate dopants and to cure crystal damage without sacrificing the electrical characteristics of the interface.

For the reasons pointed out above, in field effect transistors, silicon dioxide is preferably used as a base material of the gate insulation layer that separates the gate electrode, frequently comprised of polysilicon or metal-containing materials, from the silicon channel region. In steadily improving device performance of field effect transistors, the length of the channel region has been continuously reduced to improve switching speed and drive current capability. Since the transistor performance in terms of switching speed and drive current is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be ensured. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage, and thus reduced threshold voltage, may suffer from an exponential increase of the leakage current, while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 nm may require a gate dielectric made of silicon dioxide as thin as approximately 1.2 nm. Although, generally, usage of high speed transistor elements having an extremely short channel may be substantially restricted to high speed signal paths, whereas transistor elements with a longer channel may be used for less critical signal paths, such as storage transistor elements, the relatively high leakage current caused by direct tunneling of charge carriers through an ultra-thin silicon dioxide gate insulation layer may reach values for an oxide thickness in the range of 1-2 nm that may not be compatible with thermal design power requirements for performance driven circuits.

Therefore, replacing silicon dioxide based dielectrics as the material for gate insulation layers has been considered, particularly for extremely thin silicon dioxide based gate layers. Possible alternative materials include materials that exhibit a significantly higher permittivity so that a physically greater thickness of a correspondingly formed gate insulation layer provides a capacitive coupling that would be obtained by an extremely thin silicon dioxide layer.

Additionally, transistor performance may be increased by providing an appropriate conductive material for the gate electrode so as to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance based on the same thickness as a silicon dioxide based layer, while additionally maintaining leakage currents at an acceptable level. On the other hand, the non-polysilicon material, such as titanium nitride and the like, in combination with other metals, may be formed so as to connect to the high-k dielectric material, thereby substantially avoiding the presence of a depletion zone. Since the threshold voltage of the transistors, which represents the voltage at which a conductive channel forms in the channel region, is significantly determined by the work function of the metal-containing gate material, an appropriate adjustment of the effective work function with respect to the conductivity type of the transistor under consideration has to be guaranteed.

Providing different metal species for adjusting the work function of the gate electrode structures for P-channel transistors and N-channel transistors at an early manufacturing stage may, however, be associated with a plurality of difficulties, which may stem from the fact that a complex patterning sequence may be required during the formation of the sophisticated high-k metal gate stack, which may result in a significant variability of the resulting work function and thus threshold of the completed transistor structures. For instance, during a corresponding manufacturing sequence, the high-k material may be exposed to oxygen, which may result in an increase of layer thickness and thus a reduction of the capacitive coupling. Moreover, a shift of the work function may be observed when forming appropriate work function metals in an early manufacturing stage, which is believed to be caused by a moderately high oxygen affinity of the metal species, in particular during high temperature processes which may typically be required for completing the transistor structures, for instance, for forming drain and source regions and the like.

For this reason, in some approaches, the initial gate electrode stack may be provided with a high degree of compatibility with conventional polysilicon-based process strategies and the actual electrode metal, possibly in combination with a high-k dielectric material, and the final adjustment of the work function of the transistors may be accomplished in a very advanced manufacturing stage, i.e., after completing the basic transistor structure. In a corresponding replacement gate approach, the high-k dielectric material, if provided in this stage, may be covered by an appropriate metal-containing material, such as titanium nitride and the like, followed by a standard polysilicon or amorphous silicon material, which may then be patterned on the basis of well-established advanced lithography and etch techniques. Consequently, during the process sequence for patterning the gate electrode structure, the sensitive high-k dielectric material may be protected by the metal-containing material, possibly in combination with sophisticated sidewall spacer structures, thereby substantially avoiding any undue material modification during the further processing. After patterning the gate electrode structure, conventional and well-established process techniques for forming the drain and source regions having the desired complex dopant profile are typically performed. After any high temperature processes, the further processing may be continued, for instance, by forming a metal silicide, followed by the deposition of an interlayer dielectric material, such as silicon nitride, in combination with silicon dioxide and the like. In this manufacturing stage, a top surface of the gate electrode structures embedded in the interlayer dielectric material has to be exposed, which is accomplished by chemical mechanical polishing (CMP). The polysilicon material exposed during the CMP process is then removed and thereafter an appropriate masking regime may be applied in order to selectively fill in an appropriate metal for any type of transistors.

Although, in general, this approach may provide advantages in view of reducing process-related non-uniformities in the threshold voltages of the transistors since the high-k dielectric material, if provided in an early manufacturing stage, may be reliably encapsulated during the entire process sequence without requiring an adjustment of the work function and thus the threshold voltage at an early manufacturing stage, the complex process sequence for exposing and then removing the placeholder material and providing appropriate work function materials for the different types of transistors may also result in a significant degree of variability of the transistor characteristics, which may thus result in offsetting at least some of the advantages obtained by the common processing of the gate electrode structures until the basic transistor configuration is completed.

For example, an efficient removal of the polysilicon material may have a significant influence on the overall characteristics of the replacement gate, i.e., on the provision of appropriate work function metals for the N-channel transistor and P-channel transistor and the subsequent deposition of the actual metal-containing electrode material. For this purpose, typically, a dielectric cap layer in the form of a silicon nitride material may be maintained throughout the entire manufacturing process for forming the gate electrode structures and the basic transistor configuration, which may also act as a silicidation mask during the critical process step for forming metal silicide regions in the drain and source areas in order to suppress the formation of a metal silicide in the polysilicon material since any residues of the silicide material may not be efficiently removed. On the other hand, the cap layer has to be removed by the CMP process, which may result in process non-uniformities, as will be explained with reference to FIGS. 1a-1e.

Figure 1A:
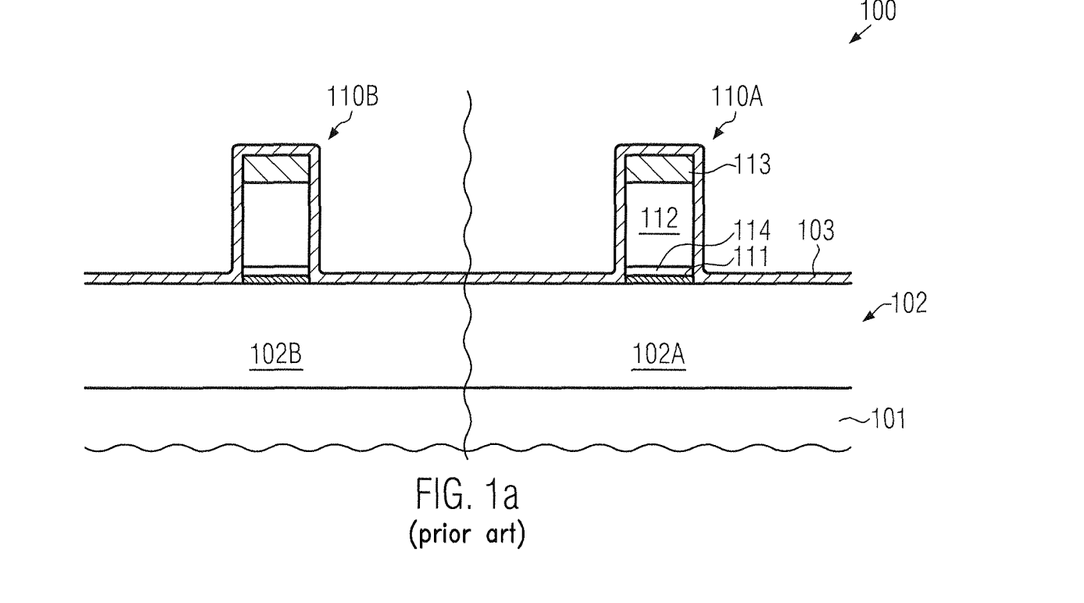
FIGS. 1a-1e schematically illustrate cross-sectional views of a semiconductor device during various manufacturing stages of a manufacturing sequence according to a replacement gate approach, based on conventional strategies.

FIG. 1a schematically illustrates a cross-sectional view of a semiconductor device 100 in an early manufacturing stage in which a first semiconductor region 102A and a second semiconductor region 102B are formed in a semiconductor layer 102, which in turn is formed above a substrate 101. The substrate 101 typically represents a silicon-based carrier material above which is formed the semiconductor layer 102, for instance in the form of a silicon-based crystalline material. Moreover, in the manufacturing stage shown, a first gate electrode structure 110A is formed above the first semiconductor region 102A and a second gate electrode structure 110B is formed above the second semiconductor region 102B. Moreover, the regions 102A, 102B and the gate electrode structures 110A, 110B are covered by a spacer layer 103, such as a silicon nitride material. The gate electrode structures 110A, 110B may comprise a sophisticated layer stack, for instance comprising a sophisticated gate dielectric material 111 comprising any high-k dielectric material as specified above, in combination with a titanium nitride cap layer 114. Furthermore, a silicon material 112 is typically formed above the cap layer 114, followed by a dielectric cap layer 113 in the form of a silicon nitride material.

The semiconductor device 100 as illustrated in FIG. 1a may be formed on the basis of the following well-established process techniques. First the semiconductor regions 102A, 102B may be formed by providing appropriate isolation structures in the semiconductor layer 102, for instance in the form of shallow trench isolations and the like, which, for convenience, are not shown in FIG. 1a. For this purpose, any appropriate process techniques may be applied. Thereafter, the complex gate material stack may be formed by oxidation and deposition techniques using any appropriate process recipes for obtaining the desired materials and the corresponding layer thickness values, such as for the gate dielectric material 111 and the cap layer 114. Thereafter, the silicon material 112 may be deposited on the basis of well-established low pressure chemical vapor deposition (CVD) techniques, followed by the deposition of the silicon nitride cap material 113. Furthermore, if required, any additional materials, such as hard mask materials and anti-reflective coating (ARC) materials, may be formed in accordance with requirements for the subsequent lithography and patterning strategies. Consequently, the gate electrode structures 110A, 110B are obtained with a desired critical length, i.e., in FIG. 1a, the horizontal extension of the material 112, which may be approximately 50 nm and less in sophisticated applications. Thereafter, the spacer layer 103 in the form of a silicon nitride material is deposited by using thermally activated CVD techniques or plasma-enhanced deposition recipes so as to obtain a desired layer thickness and material characteristics as required for the further processing. That is, the spacer layer 103 may be used for appropriately covering the sidewalls of the gate electrode structures 110A, 110B and in particular the sidewalls of the sensitive materials 111 and 114 during the further processing. Moreover, the spacer layer 103 may be used for providing sidewall spacers, which may additionally provide a corresponding lateral offset during the incorporation of dopant species for forming drain and source extension regions during the further processing of the device 100. In addition, corresponding sidewall spacer elements may be used as an etch and growth mask for incorporating a strain-inducing semiconductor material, for instance into the semiconductor region 102A, in order to create a desired strain component therein. It is well established that strain in the channel region of a field effect transistor may have a significant influence on the mobility of the charge carriers and may, therefore, result in a pronounced modification of drive current capability and thus performance of the transistor. For example, the generation of a compressive strain component in the channel region of P-channel transistors formed on the basis of a standard crystallographic configuration of a silicon layer may result in superior performance, which may be accomplished by incorporating a silicon/germanium alloy into the silicon material, which may result in a corresponding strained state, which may thus create a corresponding strain in the adjacent channel region. The incorporation of the silicon/germanium alloy is typically accomplished by forming cavities in the semiconductor region corresponding to the P-channel transistor, for instance the semiconductor region 102A, and subsequently refilling the cavities by using a selective epitaxial growth technique while substantially suppressing a material deposition on the semiconductor region 102B and the corresponding gate electrode structure 110B when representing an N-channel transistor.

Figure 1B:
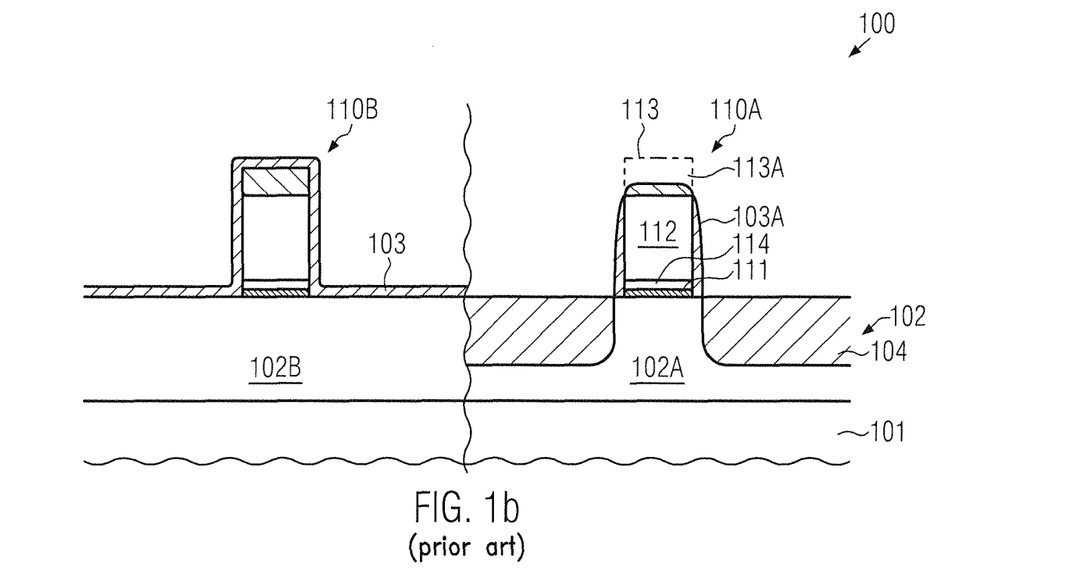

FIG. 1b schematically illustrates the semiconductor device 100 in a further advanced manufacturing stage. As illustrated, a spacer element 103A is formed on sidewalls of the gate electrode structure 110A and may represent a remaining portion of the spacer layer 103, which is substantially completely preserved above the semiconductor region 102B and the gate electrode structure 110B. Moreover, the thickness of the silicon nitride cap layer 113 may be significantly reduced, as indicated by reference sign 113A. Additionally, a silicon/germanium alloy 104 is formed in the semiconductor region 102A with a lateral offset from the gate electrode structure 110A, i.e., from the material 112, that may be based on a thickness of the sidewall spacer 103A.

The semiconductor device 100 as illustrated in FIG. 1b may typically be formed on the basis of the following processes. After providing the spacer layer 103, the region 102B and the gate electrode structure 110B are masked, for instance by a resist material, and the exposed portion of the spacer layer 103 is etched so as to form the spacer elements 103A, which may be accomplished on the basis of any well-established anisotropic etch recipe. Thereafter, an appropriate etch chemistry is selected in order to etch into the semiconductor region 102A, thereby forming corresponding cavities, the offset of which may be defined on the basis of the spacer elements 103A and the characteristics of the corresponding etch recipe. It should be appreciated that, during the etch process, a certain amount of the silicon nitride cap layer 113 may be removed. Thereafter, the remaining resist material is removed and the device 100 is treated on the basis of appropriate cleaning recipes using wet chemical chemistries in order to prepare exposed surface portions for the subsequent selective epitaxial deposition of the silicon/germanium alloy. Thereafter, the silicon/germanium alloy 104 is deposited by applying well-established deposition recipes in order to refill and, if desired, overfill the previously formed cavities. During the selective epitaxial growth process, the silicon nitride cap layer 113A in combination with the spacer element 103A act as a mask, while the region 102B and the gate electrode structure 110B are still reliably covered by the spacer layer 103. As explained above, the spacer element 103A may also act as an offset spacer during a subsequent implantation process and consequently a corresponding spacer element is also to be formed on sidewalls of the gate electrode structure 110B. Consequently, the semiconductor region 102A and the gate electrode structure 110A are masked by resist material while the spacer layer 103 is exposed to an anisotropic etch ambient in order to form corresponding spacer elements, as is also described above for the spacer element 103A.

Figure 1C:
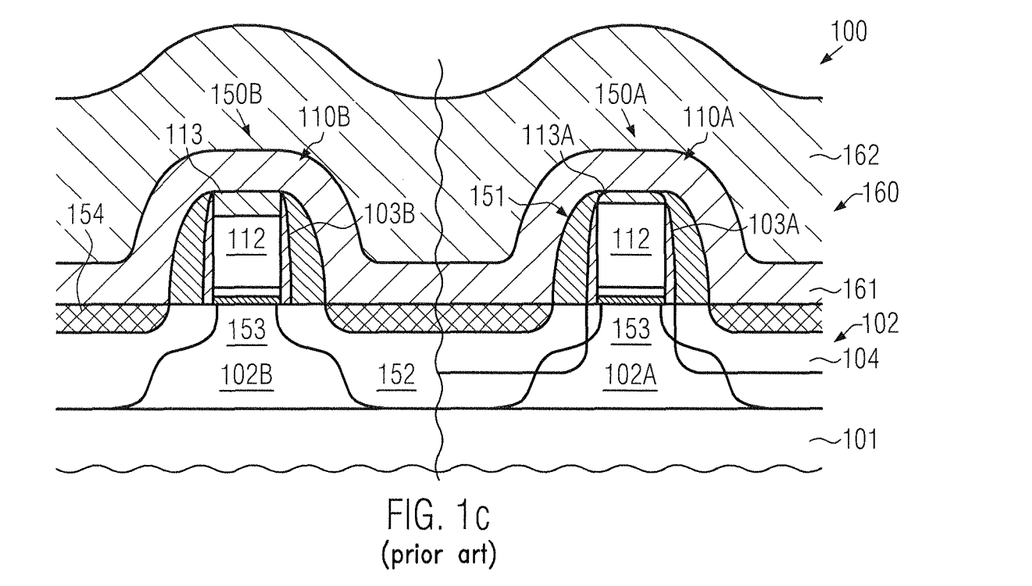

FIG. 1c schematically illustrates a cross-sectional view of the semiconductor device 100 in an advanced manufacturing stage. As illustrated, transistors 150A, 150B are formed in and above the active regions 102A, 102B in combination with the gate electrode structures 110A, 110B. The transistors 150A, 150B comprise drain and source regions 152 in combination with metal silicide regions 154. The drain and source regions 152 laterally enclose a channel region 153, which, in the transistor 150A, may have a certain compressive strain due to the presence of the silicon/germanium material 104. Furthermore, a spacer structure 151 may be formed on sidewalls of the gate electrode structures 110A, 110B, i.e., on the spacers 103A and spacer elements 103B that have been formed in accordance with the above-specified process sequence. It should be appreciated that, typically, the dielectric cap layer 113 of the gate electrode structure 110B may have a greater thickness compared to the dielectric cap layer 113A due to the difference in process history.

The transistors 150A, 150B may be formed on the basis of any appropriate process technique, for instance by incorporating appropriate dopant species in combination with providing the spacer structure 151, thereby obtaining the desired lateral and vertical dopant profile of the drain and source regions 152. After activating the dopant species and preparing exposed surface areas of the device 100 for the subsequent deposition of a refractory metal, such as nickel, platinum and the like, the metal silicide regions 154 are formed by well-established process techniques, wherein the dielectric cap layers 113A, 113 may act as a mask material in order to avoid the formation of a metal silicide in the polysilicon material 112. Next, an interlayer dielectric material 160 is formed, for instance, by depositing a first dielectric layer 161, such as a silicon nitride material and the like, which may act as an etch stop material for patterning a further dielectric material 162, possibly in combination with any additional dielectric materials still to be formed when forming contact openings in the interlayer dielectric material 160. In some cases, the material 161 may be provided in the form of a highly stressed material in order to create a desired type of strain in the channel region 153 of at least one of the transistors 150A, 150B. In sophisticated applications, the material 161 is provided with different types of internal stress above the transistors 150A, 150B in order to individually enhance performance of these devices. For this purpose, any appropriate manufacturing strategies are applied in order to deposit the desired material having the internal stress level and removing portions thereof from above one of the transistors 150A, 150B, for which the corresponding internal stress level may result in a deterioration of transistor performance.

Figure 1D:
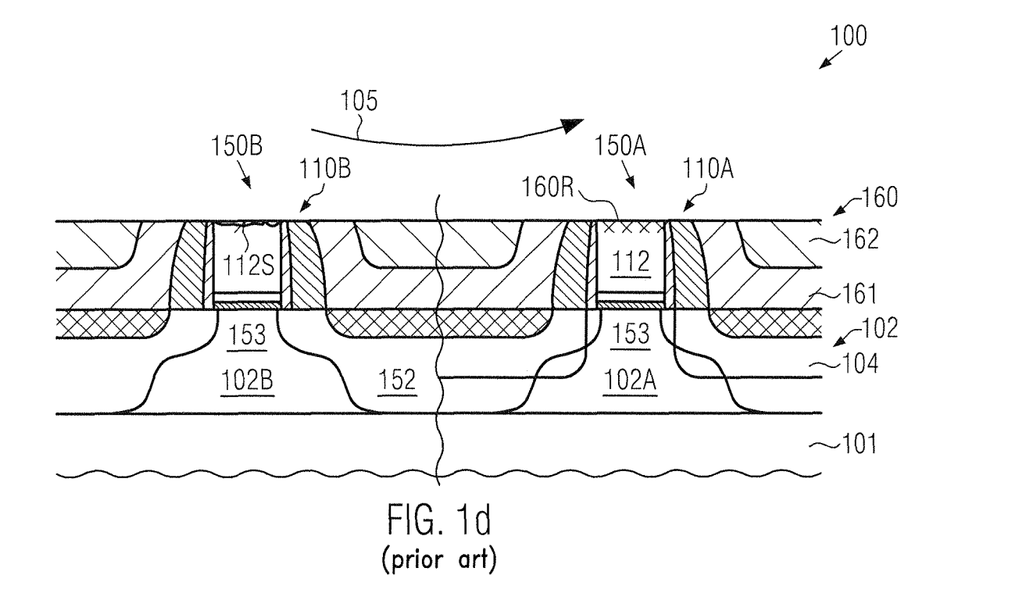

FIG. 1d schematically illustrates the semiconductor device 100 during a polishing process 105, which may be applied so as to planarize the surface of the interlayer dielectric material 160 and to remove a portion thereof so as to finally expose the material 112. Generally, a polishing process, for instance in the form of a chemical mechanical polishing (CMP) process, may rely on the physical interaction of abrasive particles supplied by a slurry material and/or being present in a polishing pad, which may contact the material 160 on the basis of well-defined process parameters, such as relative speed between the material 160 and the polishing pad, the down force and the like. Furthermore, frequently, a chemical reaction may be concurrently initiated at the surface to be polished on the basis of appropriate chemical agents contained in the slurry material. Consequently, although CMP represents a very effective process for removing materials and concurrently providing a substantially planar surface topography, the removal of different materials, such as silicon dioxide, silicon nitride, possibly in differently stressed states, may represent a very complex process step, wherein a pronounced material removal between the gate electrode structures 110A, 110B is to be avoided as a metal-containing material will be deposited in the subsequent manufacturing stage. It turns out that, during the polishing process 105, in particular the removal of the cap layers 113A, 113 (FIG. 1c) may result in significant process non-uniformities, such as material residues of the cap layer which may still be present in a surface 112S of the polysilicon material 112. For example, typically, the cap layer 113 (FIG. 1c) may have an increased thickness, which may require a certain degree of over-polish time, which on the other hand may result in the generation and incorporation of any residues 160R in the material 112 of the gate electrode structure 110A, since the material 112 may be exposed earlier due to the reduced thickness of the dielectric cap layer 113A (FIG. 1c). Furthermore, the additional polish time may result in unwanted removal of material of the gate electrode structure 110A, thereby possibly unduly reducing the height thereof, which may also result in process and device irregularities upon finishing the semiconductor device 100. Furthermore, at any transition areas (not shown) of gate electrode structures of P-channel transistors and N-channel transistors, very sophisticated polish conditions occur, since here typically the layers 161 may have an increased thickness due to the previous patterning when differently stressed materials are to be used, while also the different thickness of the cap layers 113, 113S (FIG. 1c) may contribute to a very challenging process situation during the polishing process 105.

Figure 1E:
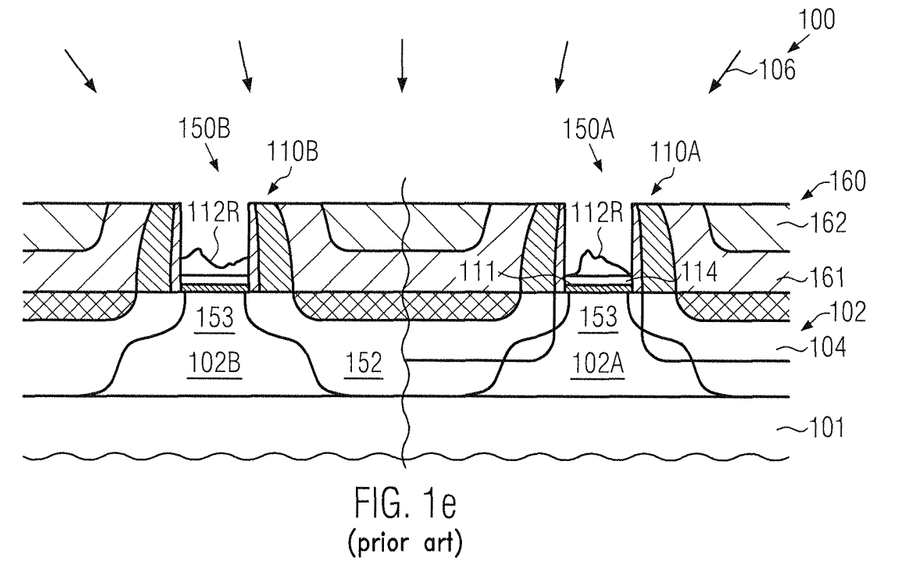

FIG. 1e schematically illustrates the semiconductor device 100 when exposed to an etch process 106 that is performed on the basis of an appropriate etch chemistry in order to remove the material 112 (FIG. 1d) selectively to the interlayer dielectric material 160 and the cap layer 114. For instance, very selective etch chemistries are available so as to efficiently remove polysilicon material substantially without unduly damaging the cap layer 114 and the underlying high-k dielectric material, while also substantially maintaining the dielectric materials. However, due to the presence of non-removed portions or any other polishing-related residues as described above with reference to FIG. 1d, the polysilicon material may not be completely removed so that corresponding residues 112R may still be present after the etch process 106. However, applying any pronounced over-etch times may not be a desirable option in view of integrity of the layers 114 and 111.

Consequently, during the further processing, i.e., during the deposition of metal-containing material layers for adjusting the work function of the gate electrode structures 110A, 110B and for providing a metal-containing electrode material, the polysilicon residues 112R significantly contribute to yield losses due to severe failures of the gate electrode structures or due to a pronounced variability in transistor characteristics.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to sophisticated transistor elements in which the final characteristics of gate electrode structures, such as work function, final gate conductivity and the like, may be adjusted in a very advanced manufacturing stage by replacing a gate material with a metal-containing species, possibly in combination with a high-k dielectric material, thereby adjusting an appropriate work function and obtaining a highly conductive gate electrode material. To this end, the dielectric cap layer, that is provided so as to act as an etch and deposition mask when providing a strain-inducing semiconductor alloy and/or to act as a mask for avoiding the formation of a metal silicide in the gate material, may be efficiently removed so as to reliably expose the gate material, while avoiding extremely sophisticated polishing processes, which may contribute to significant process-related irregularities in conventional strategies. According to the principles disclosed herein, the placeholder material of the gate electrode structure may be efficiently exposed on the basis of an etch process, which, in some illustrative embodiments disclosed herein, may be performed on the basis of superior process conditions, since a single material system may be provided above the placeholder material upon exposing a top surface thereof. Consequently, a plurality of very efficient etch recipes, such as plasma-assisted etch recipes, wet chemical etch recipes and the like, may be applied in order to efficiently expose the placeholder material without compromising other device parameters, such as gate height and the like, while at the same time any material residues may be efficiently removed from the surface of the placeholder material prior to performing the selective etch process for removing the placeholder material.

One illustrative method disclosed herein comprises forming a sacrificial mask material above a gate electrode structure of a transistor, wherein the gate electrode structure comprises a placeholder material and a dielectric cap layer formed above the placeholder material. The method further comprises removing the dielectric cap layer in the presence of the sacrificial mask material so as to expose a surface of the placeholder material. Moreover, the sacrificial mask material is removed and a material layer is formed above the transistor. The method additionally comprises removing a portion of the material layer by performing an etch process so as to expose the surface of the placeholder material. Furthermore, the method comprises replacing the placeholder material with a metal-containing electrode material.

A further illustrative method disclosed herein comprises removing a dielectric cap layer formed in a gate electrode structure of a transistor, wherein the gate electrode structure comprises a placeholder material formed below the dielectric cap layer. The method further comprises forming a protective material laterally adjacent to and above the gate electrode structure. The method additionally comprises removing a portion of the protective material by performing an etch process so as to expose a surface of the placeholder material. Additionally, the method comprises removing the placeholder material through the exposed surface.

A still further illustrative method disclosed herein comprises forming a mask material laterally adjacent to a first gate electrode structure and a second gate electrode structure of a semiconductor device. The first gate electrode structure comprises a first dielectric cap layer formed above a first placeholder material and the second gate electrode structure comprises a second dielectric cap layer formed above a second placeholder material. The method further comprises performing at least one etch process in the presence of the mask material so as to remove the first and second dielectric cap layers and to expose the first and second placeholder materials. Additionally, the method comprises replacing the first and second placeholder materials by a first and second metal-containing electrode material, respectively.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides manufacturing techniques for efficiently exposing a placeholder material of gate electrode structures in a late manufacturing stage by avoiding complex polishing processes and applying one or more etch processes, which, in some illustrative embodiments disclosed herein, may be applied on the basis of a simplified material system, thereby achieving superior process uniformity and avoiding irregularities, such as variations in gate height and the like. At the same time, any residuals, such as oxides, silicon nitride residuals and the like, may be efficiently removed upon exposing the placeholder material on the basis of one or more etch processes, so that the subsequent processes, such as the removal of the placeholder material, may be performed on the basis of superior process conditions, thereby also contributing to enhanced transistor characteristics.

In some illustrative embodiments, a sacrificial mask material may be provided so as to protect sidewall spacer structures and other device components prior to depositing an interlayer dielectric material, such as a silicon dioxide material, so that the dielectric cap material, possibly in combination with a previously-deposited dielectric material, such as an etch stop material, may be removed from above the gate electrode structures. Thereafter, the interlayer dielectric material may be efficiently deposited and possibly planarized, thereby providing a material system above the placeholder material, which may include the interlayer dielectric material only, thereby providing superior process conditions for an etch process, in which a portion of the interlayer dielectric material may be efficiently removed so as to expose the surface of the placeholder material of the gate electrode structures. To this end, well-established plasma-assisted etch recipes, wet chemical etch recipes and the like may be applied, since only a single material may have to be etched so as to expose the placeholder materials. Consequently, process parameters of the etch process may be appropriately selected, for instance in view of etch selectivity, in order to obtain a desired etch result, for instance with respect to controllability of the etch process when exposing the polysilicon placeholder material. Thus, a desired high degree of integrity of any circuit components, such as metal silicide regions, may be accomplished by providing the contact etch stop layer, for instance in the form of a silicon nitride material, possibly in the form of a highly stressed dielectric material that may have a different internal stress level for P-channel transistors and N-channel transistors, as previously discussed with reference to the semiconductor device 100, wherein the contact etch stop layer may, however, be efficiently removed in an earlier process step, thereby enabling the final efficient exposure of the placeholder material on the basis of the interlayer dielectric material.

The contact etch stop layer and the dielectric cap layer may be efficiently removed on the basis of any appropriate sacrificial material, such as a resist material, a polymer material or any material, such as amorphous carbon and the like, which may be removed in a very efficient manner in a later manufacturing stage.

In other illustrative embodiments, an appropriate mask material, such as amorphous carbon and the like, may be efficiently used as a protective material or mask material for removing the dielectric cap layers and efficiently exposing the placeholder material on the basis of one or more etch processes, wherein the mask material may then be efficiently removed and the actual interlayer dielectric material may be deposited.

With reference to FIGS. 2a-2j, further illustrative embodiments will now be described in more detail, wherein reference may also be made to FIGS. 1a-1e, if required.

Figure 2A:
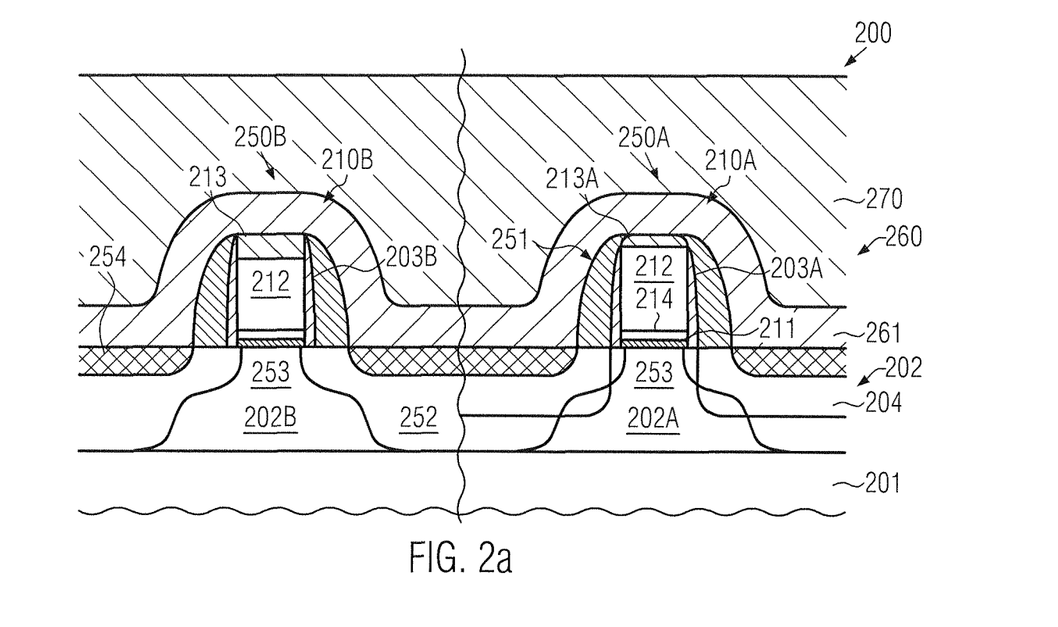
FIGS. 2a-2d schematically illustrate cross-sectional views of a semiconductor device during various manufacturing stages, when applying a replacement gate approach by removing a dielectric cap material of gate electrode structures on the basis of a sacrificial mask material, according to illustrative embodiments.

FIG. 2a schematically illustrates a cross-sectional view of a semiconductor device 200 comprising a substrate 201 and a semiconductor layer 202. The semiconductor layer 202 may comprise a first active region 202A and a second active region 202B, in and above which are formed transistors 250A, 250B, respectively. With respect to any characteristics of the substrate 201 and the semiconductor layer 202, the same criteria may apply as previously explained with reference to the device 100. It should be appreciated that a buried insulating layer (not shown) may be provided between the substrate 201 and the semiconductor layer 202, if a silicon-on-insulator (SOI) architecture is considered. In the manufacturing stage shown, the transistors 250A, 250B may comprise drain and source regions 252 in combination with metal silicide regions 254 and a channel region 253, whereas the characteristics of gate electrode structures 210A, 210B may still have to be adjusted by replacing a portion of the gate electrode structures 210A, 210B, as is also previously explained. Furthermore, in some illustrative embodiments, one or both of the transistors 250A, 250B may have incorporated in the corresponding active regions 202A, 202B a strain-inducing semiconductor alloy, such as a silicon/germanium alloy, a silicon/carbon alloy and the like. For example, the transistor 250A may have incorporated therein a strain-inducing semiconductor alloy 204.

The gate electrode structure 210A may comprise a gate dielectric material 211, which may include a high-k dielectric material, possibly in combination with conventional dielectrics, such as silicon oxide based materials and the like. In this case, typically, a conductive cap layer 214 may be formed on the gate dielectric material 211. In other cases, the gate dielectric material 211 may represent, in this manufacturing stage, a conventional dielectric material, which may be replaced, at least partially, by a high-k dielectric material in a later manufacturing stage. In this case, the conductive cap layer may be omitted. Furthermore, a placeholder material 212, for instance in the form of polysilicon, polycrystalline silicon/germanium and the like, may be formed above the layer 214. Moreover, a dielectric cap layer 213A in combination with sidewall spacers 203A may provide the integrity of the gate electrode structure 210A, if required. The gate electrode structure 210B may have a similar configuration, while, in some cases, as discussed above, the dielectric cap layer 213 may have a different thickness compared to the layer 213A due to a different process history, for instance in view of incorporating the material 204 in the active region 202A and the like. Moreover, a sidewall spacer structure 251 may be provided on sidewalls of the gate electrode structures 210A, 210B. Moreover, in the embodiment shown, a dielectric layer 261, such a silicon nitride material and the like, which may also be referred to as a contact etch stop layer, may be provided in the form of any appropriate material, such as silicon nitride, nitrogen-containing silicon carbide and the like. The dielectric layer 261 may have any appropriate thickness, for instance approximately 10-20 nm or higher, thereby enabling a reliable and conformal deposition of the layer 261 in sophisticated device geometries, for instance including transistor elements having a gate length of 50 nm and less, while a distance between neighboring transistors may be approximately 100 nm and less. The dielectric layer 261 or at least a portion thereof may be provided in the form of a highly stressed material in order to enhance performance of one or both of the transistors 250A, 250B.

In the manufacturing stage shown, a mask material 270 may be formed above the transistors 250A, 250B, thereby covering the corresponding gate electrode structures 210A, 210B. The mask material 270 may be provided, for instance, in the form of an organic material, such as a resist material or any other polymer material that may be applied in a low viscous state so as to obtain a substantially planar surface topography upon depositing the material 270 without any additional process steps.

The semiconductor device 200 as illustrate in FIG. 2a may be formed on the basis of any appropriate process technique for providing the gate electrode structures 210A, 210B, as is, for instance, also described above with respect to the semiconductor device 100. After forming the metal silicide regions 254 based on any appropriate manufacturing strategy with the dielectric cap layers 213A, 213 acting as an efficient mask, the layer or layers 261 may be deposited, followed by the deposition of the mask material 270, which may be accomplished on the basis of spin-on techniques and the like. In other cases, any other appropriate material, such as amorphous carbon and the like, may be provided, for instance, by CVD techniques, possibly in combination with an appropriate planarization process for providing a superior surface topography, if required.

Figure 2B:
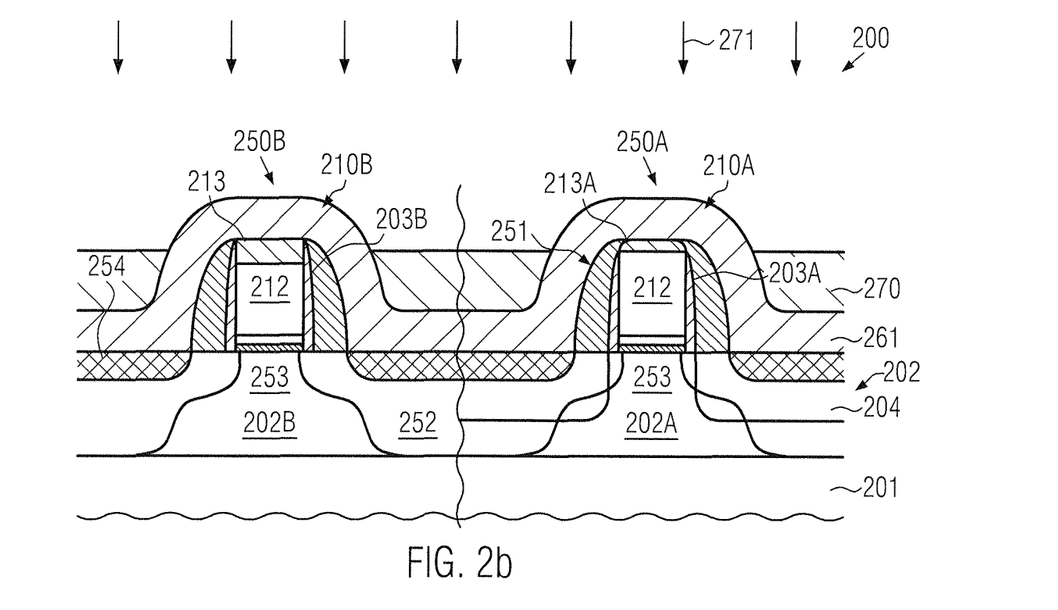

FIG. 2b schematically illustrates the semiconductor device 200 when subjected to a material removal process 271 in order to remove a portion of the mask material 270. For example, the removal process may be performed on the basis of a plasma-assisted etch ambient including appropriate reactive components, such as oxygen, fluorine and the like. It should be appreciated that a plurality of plasma-assisted etch recipes are available for etching polymer materials, such as resist materials and the like. In other cases, in addition to or alternatively to an etch process, the removal process 271 may comprise a polishing process, which may be performed on the basis of appropriately selected polishing parameters, which may be efficiently determined on the basis of experiments and the like. During the removal process 271, the dielectric layer 261 may be efficiently exposed above the gate electrode structures 210A, 210B, while, in other cases, when the dielectric cap layer 261 has been omitted in the preceding manufacturing flow, the dielectric cap layers 213A, 213 may be reliably exposed.

Figure 2C:
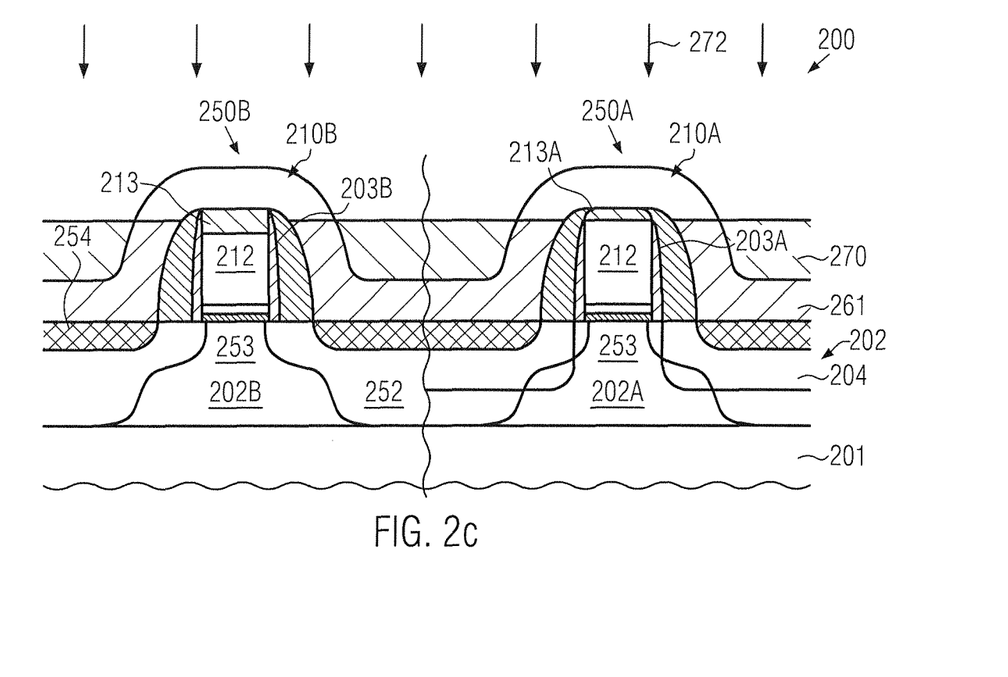

FIG. 2c schematically illustrates the semiconductor device 200 when exposed to a further material removal process 272, which, in one illustrative embodiment, may be established in the form of a plasma-assisted etch process. For example, a plurality of etch chemistries are available in order to etch dielectric materials, such as silicon nitride, nitrogen-containing silicon carbide and the like, in the presence of a mask material, such as the material 270, which may exhibit a significantly lower etch rate. For example, resist materials may be efficiently used as etch masks in a plurality of plasma-assisted etch processes for removing any of the above-identified dielectric materials. Consequently, during the etch process 272, the exposed portion of the layer 261 may be removed and the cap layers 213A, 213 may finally be exposed and removed during the etch process 272. In other cases, when the dielectric materials 261 and 213A, 213 may have a different etch behavior, an appropriate etch chemistry may be applied upon exposing the dielectric cap layers 213A, 213 during the etch process 272. During the removal of the cap layers 213A, 213, a pronounced selectivity may be achieved with respect to the placeholder materials 212. That is, the process 272 may efficiently remove material of the layers 261 and 213A, 213, while an etch rate in the material 212 is significantly less. To this end, a plurality of highly selective plasma-assisted etch recipes are available, in which silicon nitride based materials may be removed selectively with respect to polysilicon material. Consequently, the etch process 272 may be performed so as to completely remove the layers 213A, 213, even if these layers have a different thickness, without contributing to a significant difference in height of the placeholder materials 212. Hence, the gate height of the structures 210A, 210B may be substantially the same after the removal of the layers 213A, 213, thereby providing superior process conditions during the further processing.

In other illustrative embodiments, the etch process 272 or any sequence of etch processes for removing an exposed portion of the dielectric layer 261 and the cap layers 213A, 213 may include a wet chemical etch process, for instance based on hot phosphoric acid, if silicon nitride materials are considered, and the like, wherein a sacrificial mask material 270 may provide high integrity of metal silicide regions 254 and the silicon nitride based sidewall spacer elements.

Figure 2D:
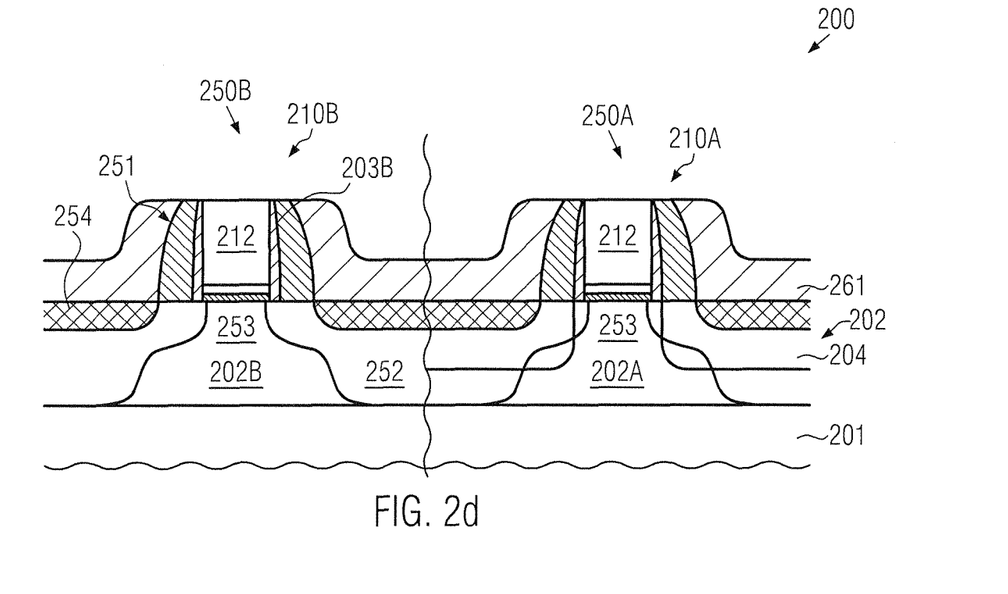

FIG. 2d schematically illustrates the semiconductor device 200 in a further advanced manufacturing stage, in which the placeholder materials 212 may be exposed in the gate electrode structures 210A, 210B due to the preceding removal process 272 (FIG. 2c). Furthermore, the sacrificial mask material 270 (FIG. 2c) may have been removed, which may be accomplished by applying any appropriate etch recipe, such as resist etching and the like, while, in other cases, wet chemical etch recipes may be applied. In some illustrative embodiments, the removal process 272 (FIG. 2c) and a corresponding process for removing the mask material 270 (FIG. 2c) may be accomplished as an in situ process, i.e., these process steps may be performed in the same process chamber without requiring any intermediate transport activities and the like. Moreover, the exposure of a portion of the dielectric layer 261 (FIG. 2b) may be accomplished in the same process chamber, thereby providing a very efficient process sequence.

Figure 2E:
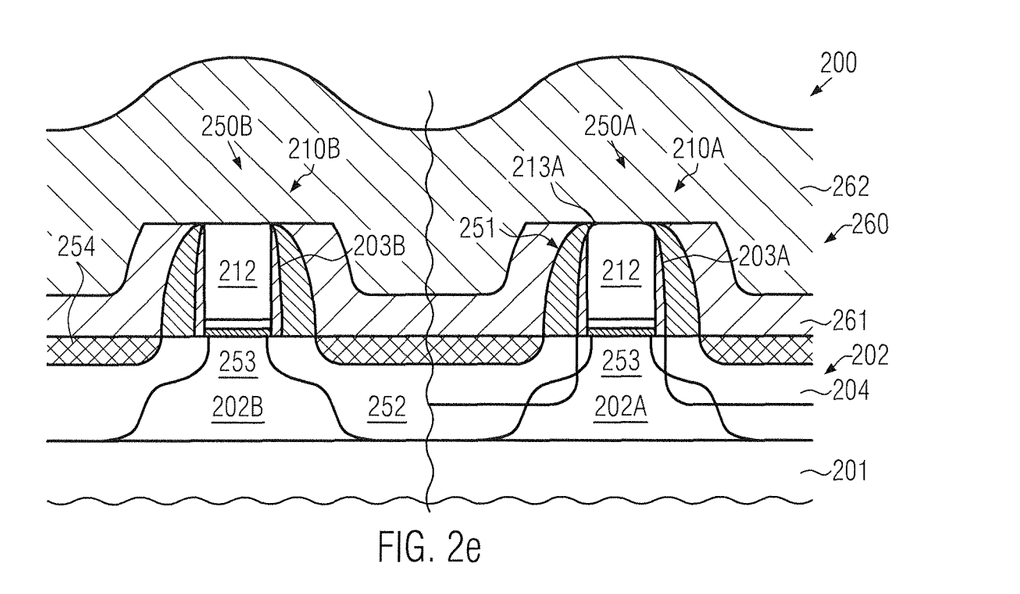
FIGS. 2e-2g schematically illustrate cross-sectional views of the semiconductor device during further advanced manufacturing stages, in which an interlayer dielectric material or a protective material may be provided above gate electrode structures and may be subsequently etched so as to expose the placeholder material with superior uniformity, according to illustrative embodiments.

FIG. 2e schematically illustrates the semiconductor device 200 in a further advanced manufacturing stage. As illustrated, an interlayer dielectric material 260 may be provided above the transistors 250A, 250B, which may comprise a dielectric material 262, such as a silicon dioxide material, while the dielectric layer 261 may also be considered as a part of the interlayer dielectric material. In other cases, the material 262 may be provided in the form of a protective material, such as amorphous carbon and the like, which may have a very pronounced etch selectivity during the further processes when removing the placeholder materials 212. It should be appreciated that the material 262, for instance in the form of a permanent interlayer dielectric material or in the form of a sacrificial protective material, may be provided on the basis of well-established CVD techniques.

Figure 2F:
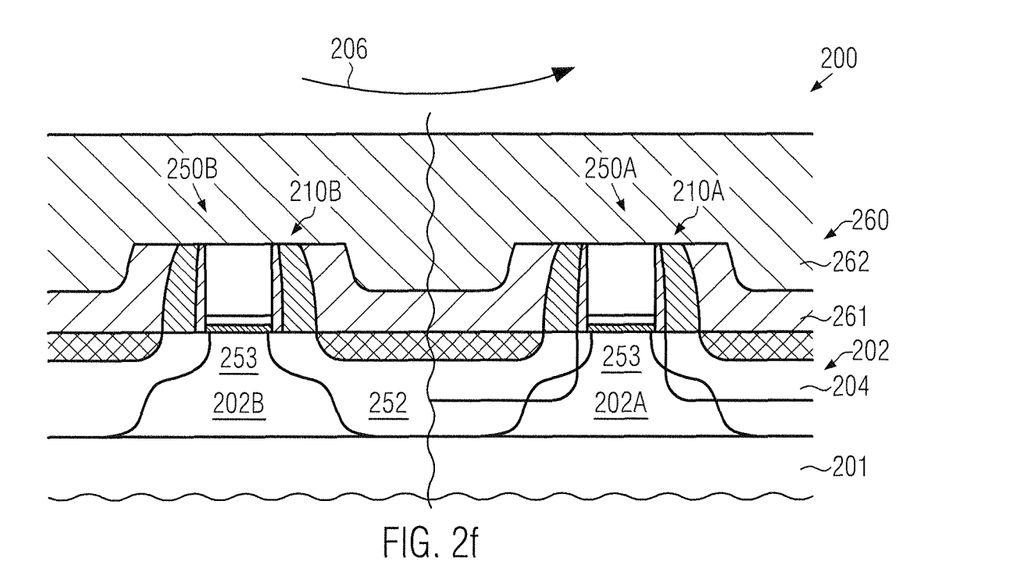

FIG. 2f schematically illustrates the semiconductor device 200 according to illustrative embodiments in which the surface topography of the material 262 may be improved by performing a planarization process 206, such as a polishing process and the like. For example, well-established silicon dioxide polishing recipes may be used, as may also typically be applied when forming the interlayer dielectric material and patterning the same to form contact openings in process strategies without requiring the replacement of gate materials in an advanced manufacturing stage. In other cases, a superior surface topography, if required, may be accomplished on the basis of an etch process, possibly in combination with a planarization material, such as polymer materials and the like, which may have a similar etch rate as the material 262.

Figure 2G:
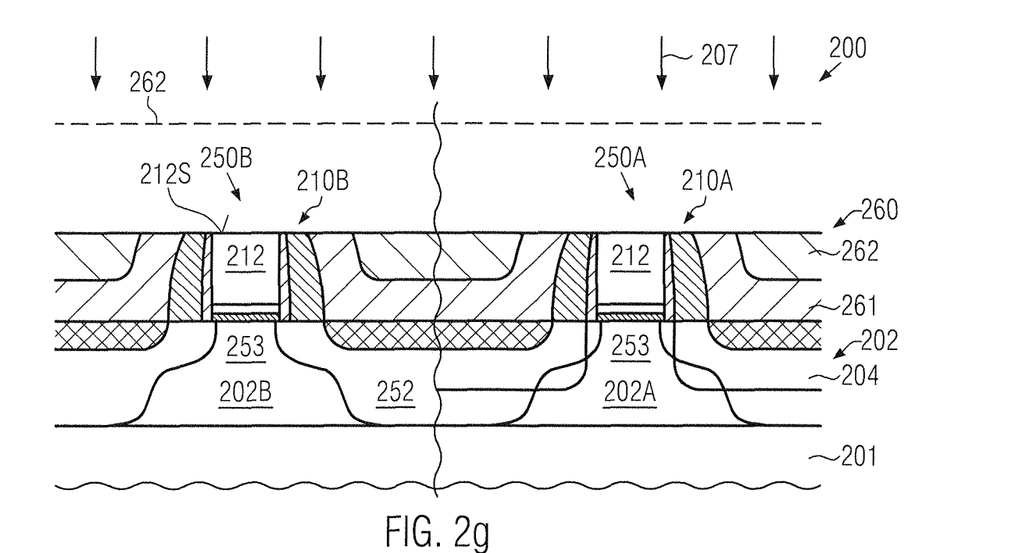

FIG. 2g schematically illustrates the semiconductor device 200 during an etch process 207, in which a portion of the material 262 may be removed, thereby finally exposing a top surface 212S of the placeholder materials 212. The etch process 207 may be performed on the basis of plasma-assisted etch recipes, wet chemical etch recipes and the like, for which a plurality of very efficient etch recipes are available. For example, silicon dioxide material may be efficiently etched selectively with respect to polysilicon material on the basis of plasma-assisted etch techniques and wet chemical etch techniques, wherein, since any other materials, such as silicon nitride and the like, are no longer formed above the surface 212S, appropriate process parameters may be adjusted so as to provide a desired high selectivity with respect to the material 212. Consequently, superior uniformity in a local and global manner may be achieved in the device 200 compared to the extremely complex polishing strategies, which are typically applied in the conventional replacement gate approach, as described above. Furthermore, since the surface areas 212S of the placeholder materials 212 may have been exposed in an earlier manufacturing stage on the basis of the mask material 270 (FIG. 2c), any material residuals may be efficiently removed, since the surface 212S may be exposed to the reactive etch ambient or any appropriate cleaning processes prior to performing the etch process 207. If required, an additional cleaning process may be applied so as to further improve the condition of the exposed surface areas 212S.

Figure 2H:
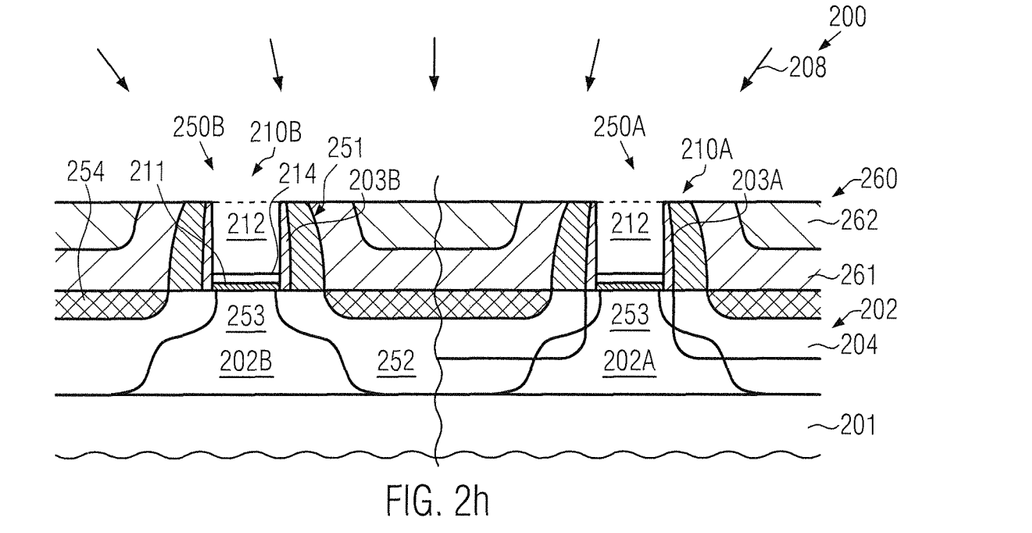
FIGS. 2h-2i schematically illustrate the semiconductor device in manufacturing stages in which the placeholder materials may be replaced with appropriate gate materials, according to illustrative embodiments.

FIG. 2h schematically illustrates the semiconductor device 200 during a selective etch process 208 in order to remove the placeholder materials 212 selectively with respect to the conductive cap material 214, if provided, or selectively to the dielectric material 211 and also selectively with respect to the sidewall spacer structure 203A, 203B and 251 and the dielectric materials 262 and 261. In this case, efficient wet chemical etch recipes may be applied, such as TMAH (tetra methyl ammonium hydroxide), or any other appropriate hydroxide solutions and the like, wherein superior efficiency may be achieved due to the reliable exposure of the material 212. Furthermore, any polishing-related residual, as may typically be produced in the conventional strategy, may be avoided, thereby providing reliable removal of the placeholder material 212.

Figure 2I:
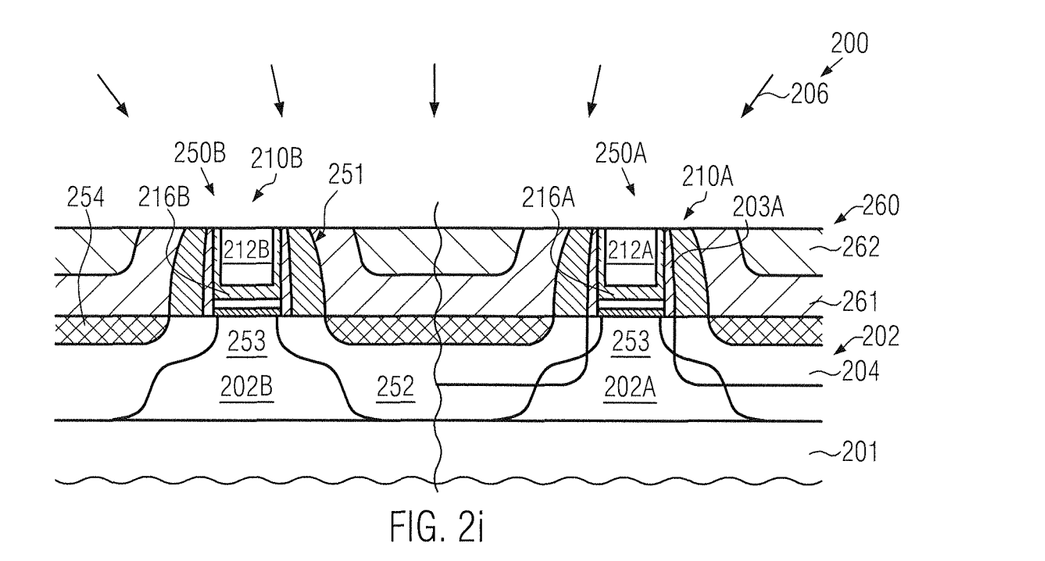

FIG. 2i schematically illustrates the semiconductor device 200 in a further advanced manufacturing stage, in which the gate electrode structure 210A may comprise a work function adjusting species 216A in combination with an appropriate metal-containing electrode material 212A, while the gate electrode structure 210B may comprise a corresponding work function adjusting species 216B in combination with a metal-containing electrode material 212B. It should be appreciated that the materials 212A, 212B may be formed on the basis of any appropriate deposition and patterning strategy, possibly in combination with appropriate heat treatments and the like. Similarly, the electrode materials 212A, 212B, which may be partly the same, may be applied by any appropriate process sequence, for instance by CVD, sputter deposition, electrochemical deposition, followed by the subsequent removal of any excess material on the basis of CMP techniques and the like. Thus, the metal-containing materials may be provided with superior uniformity and reliability, since the placeholder material 212 (FIG. 2h) may be efficiently removed, as discussed above. It should be appreciated that, in this manufacturing phase, a high-k dielectric material may also be incorporated into the gate electrode structures 210A, 210B, if any such material has not been provided in an early manufacturing stage. To this end, appropriate deposition techniques, such as atomic layer deposition and the like, may be applied in accordance with well-established recipes, wherein, also in this case, the superior removal efficiency for the placeholder materials 212 (FIG. 2h) may provide enhanced process conditions when forming a high-k dielectric material.

In other illustrative embodiments, after providing the gate electrode structures 210A, 210B with appropriate gate materials, the dielectric material 262 may be removed, when representing a protective sacrificial material. For example, when using an amorphous carbon material, which may provide superior etch resistivity during the previous process sequence, an efficient removal process may be performed on the basis of oxygen plasma recipes, thereby not unduly affecting the gate electrode structures 210A, 210B. Thereafter, the actual interlayer dielectric material, such as silicon dioxide, may be deposited on the basis of any appropriate deposition strategies. Next, the processing may be continued by forming contact elements in the interlayer dielectric material by using any appropriate process technique.

Figure 2J:
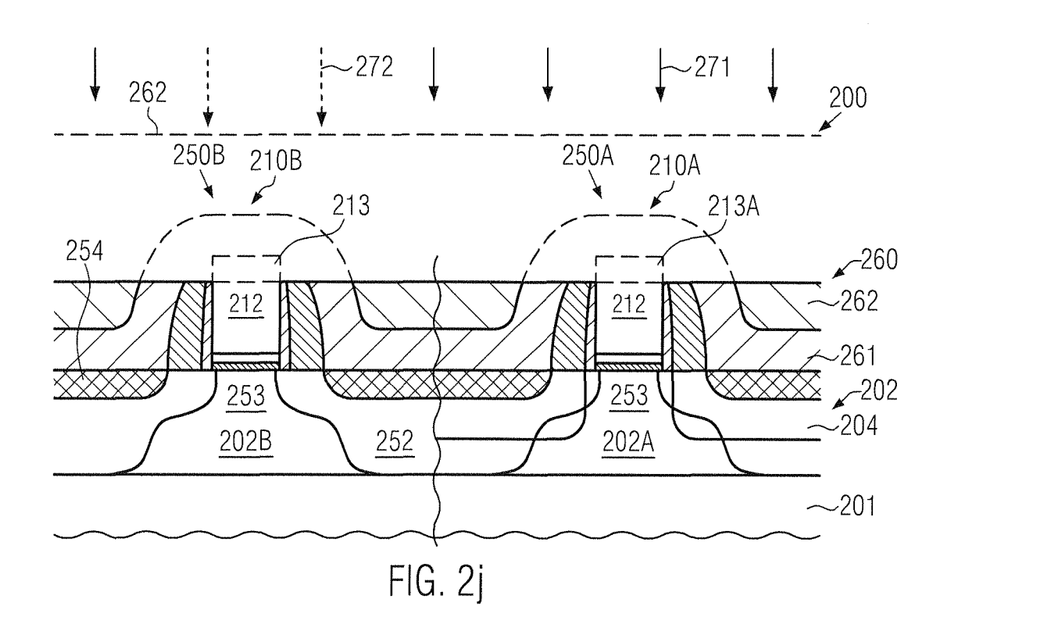
FIG. 2j schematically illustrates a cross-sectional view of the semiconductor device according to illustrative embodiments in which a sacrificial material may be used to expose placeholder materials on the basis of one or more etch processes and to preserve integrity of other device components, while the interlayer dielectric material may be provided after removing the sacrificial mask material.

FIG. 2j schematically illustrates the semiconductor device 200 according to further illustrative embodiments. As illustrated, the semiconductor device 200 may have formed thereon the material 262, which may act as a protective mask material and which may be provided in the form of amorphous carbon material and the like. To this end, the material 262 may be deposited on the basis of CVD techniques and the like. If required, a planarization process, such as an etch process, a CMP process and the like, may be applied in order to provide a superior surface topography. Thereafter, the device 200 may be exposed to the etch process 271, which may be appropriately configured so as to remove a portion of the material 262, as indicated by the dashed line, thereby exposing the material 261 above the gate electrode structures 210A, 210B, as is also previously discussed. The etch process 271 may be performed on the basis of plasma-assisted etch recipes, wet chemical etch recipes and the like, depending on the etch behavior of the material 262. For example, oxygen plasma based processes may be applied for amorphous carbon material. After exposure of the material 261, the etch process 272 may be applied in order to remove the exposed portion of the material 261 and also to remove the cap layers 213, 213A, wherein the protective material 262 may provide integrity of the remaining device components. For example, the process 272 may be performed on the basis of any wet chemical etch recipe or plasma-assisted etch recipe, wherein the superior etch resistivity of the material 262 may ensure integrity of the remaining device components. During the etch process 272, process parameters may be efficiently determined such that a reliable exposure of placeholder materials 212 may be accomplished. For example, the materials 261, 213, 213A, may have substantially the same etch behavior and may thus be removed on the basis of well-established etch recipes, while a high degree of etch selectivity with respect to the materials 212 may result in substantially the same gate height after the etch process 272. In other illustrative embodiments, the dielectric material 261 may not be provided in this manufacturing stage and the protective material 262 may be formed directly on the metal silicide regions 254, thereby reducing the amount of material that has to be removed during the etch process 272. On the other hand, the material 262 may reliably protect the sensitive metal silicide regions 254.

Thus, after the etch process 272, the further processing may be continued by removing the reliably exposed placeholder materials 212, for instance on the basis of process techniques as described above, and appropriate electrode materials may be filled into the gate electrode structures 210A, 210B, as described above. During the corresponding process sequence, the protective material 262 may still preserve integrity of other device areas. Thereafter, the material 262 may be efficiently removed, for instance on the basis of an oxygen plasma and the like, and the processing may be continued by depositing one or more dielectric materials, such as silicon nitride, silicon dioxide and the like.

As a result, the present disclosure provides techniques in which a placeholder gate material may be efficiently replaced with metal-containing materials, possibly in combination with a high-k dielectric material, wherein the placeholder material may be exposed without requiring a complex polishing process, thereby providing superior overall process uniformity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:
1. A method, comprising:
   forming first and second gate electrode structures of respective first and second transistors above respective first and second active regions of a semiconductor device, each of said first and second gate electrode structures comprising a placeholder material and a dielectric cap layer having a first thickness formed above said placeholder material;

selectively reducing said thickness of said dielectric cap layer of said second gate electrode structure from said first thickness to a second thickness that is less than said first thickness;

after selectively reducing said thickness of said dielectric cap layer of said second gate electrode structure, forming an etch stop layer above said first and second transistors;

forming a sacrificial mask layer above said etch stop layer, wherein an upper surface of said sacrificial mask layer is at a height level relative to said first and second active regions that is above a height level of an upper surface of said dielectric cap layer of each of said first and second gate electrode structures;

performing a material removal process to remove an upper thickness portion of said sacrificial mask layer from above said first and second transistors, wherein performing said material removing process comprises reducing said height level of said upper surface of said sacrificial mask layer to a height level that is below said upper surface of said dielectric cap layer of at least one of said first and second gate electrode structures so as to expose portions of said etch stop layer formed above said dielectric cap layer of each of said first and second gate electrode structures;

exposing a surface of said placeholder material of each of said first and second gate electrode structures by performing a common etch process in the presence of a remaining lower thickness portion of said sacrificial mask layer to remove said exposed portions of said etch stop layer, and to remove said dielectric cap layer having said first thickness and said dielectric cap layer having said second thickness from said first and second gate electrode structures, respectively;

removing an entirety of said remaining lower thickness portion of said sacrificial mask layer;

after exposing said surface of said placeholder of each of said first and second transistors and removing said entirety of said remaining lower thickness portion of said sacrificial mask layer, forming a dielectric material layer above said semiconductor device, said dielectric material layer covering said first and second transistors; and removing a portion of said dielectric material layer from above said semiconductor device during a second common etch process, said second common etch process re-exposing said surface of said placeholder material of each of said first and second gate electrode structures.

2. The method of claim 1, wherein selectively reducing said thickness of said dielectric cap layer of said second gate electrode structure comprises performing an etch process to form a cavity in said second active region adjacent to sidewalls of second gate electrode structure.

3. The method of claim 1, wherein forming said etch stop layer comprises forming a substantially conformal stressed dielectric material layer.

4. The method of claim 1, wherein a conductivity type of said first transistor is different from a conductivity type of said second transistor.

5. The method of claim 1, further comprising, after selectively reducing said thickness of said dielectric cap layer of said second gate electrode structure and prior to forming said etch stop layer above said first and second transistors, forming a spacer adjacent to sidewalls of each of said first and second gate electrode structures, said spacer covering sidewalls of said placeholder material and sidewalls of said dielectric cap layer of each of said first and second gate electrode structures, wherein said etch stop layer is separated from said sidewalls of said dielectric cap layer of each of said first and second gate electrode structures by an upper portion of said respective spacers, and wherein performing said common etch process comprises removing said upper portion of said spacers.

6. A method, comprising:
forming first and second gate electrode structures of respective first and second transistors of a semiconductor device, said first and second gate electrode structures comprising a placeholder material and a dielectric cap layer formed above said placeholder material, wherein a first dielectric cap layer of said first gate electrode has a first cap thickness and a second dielectric cap layer of said second gate electrode has a second cap thickness that is greater than said first cap thickness;

forming a conformal etch stop layer above said first and second gate electrode structures;

after forming said conformal etch stop layer, forming a sacrificial mask material above said first and second transistors, wherein after forming said sacrificial mask layer an upper surface thereof is at a height level that is below a height level of an upper surface of each of said first and second dielectric cap layers and first and second portions of said conformal etch stop layer formed above said first and second dielectric cap layers, respectively, are exposed for further processing;

performing a common etch process to remove said exposed first and second portions of said conformal etch stop layer from above said respective first and second dielectric cap layers, and to remove said first and second dielectric cap layers from said first and second gate electrode structures, respectively, in the presence of said sacrificial mask material, said common etch process exposing a surface of said placeholder material of each of said first and second gate electrode structures;

removing an entirety of said sacrificial mask material;

after removing said entirety of said sacrificial mask material, forming a material layer above said first and second transistors and in contact with said exposed surface of said placeholder material of each of said first and second gate electrode structures;

removing a portion of said material layer by performing a further etch process so as to re-expose said surface of said placeholder material of each of said first and second gate electrode structures; and replacing said placeholder material of each of said first and second gate electrode structures with a metal-containing electrode material.

7. The method of claim 6, wherein forming said material layer comprises forming a portion of an interlayer dielectric material of said semiconductor device.

8. The method of claim 7, wherein forming said material layer further comprises performing a planarization process prior to performing said further etch process to remove said portion of said material layer.

9. The method of claim 6, wherein removing said first and second dielectric cap layers, removing said portions of said conformal etch stop layer, and removing said entirety of said sacrificial mask material are performed as an in situ process.

10. The method of claim 6, wherein forming said sacrificial mask material comprises applying said sacrificial mask material in a state of low viscosity so as to provide a substantially planar surface topography.

11. The method of claim 6, wherein forming said material layer comprises forming a sacrificial material layer and removing said sacrificial material layer after replacing said placeholder material of each of said first and second gate electrode structures.

12. The method of claim 11, further comprising forming an interlayer dielectric material above said semiconductor device after removing said sacrificial material layer.

13. The method of claim 12, wherein said sacrificial material layer comprises amorphous carbon material.

14. The method of claim 6, further comprising, prior to forming said conformal etch stop layer above said first and second gate electrode structures, forming first and second sidewall spacers adjacent to sidewalls of said respective first and second gate electrode structures, wherein upper portions of said first and second sidewall spacers cover respective sidewalls of said first and second dielectric cap layers and separate said conformal etch stop layer from said respective sidewalls of said first and second dielectric cap layers, and wherein performing said common etch process comprises removing said upper portions of said respective first and second sidewalls spacers.

15. A method, comprising:
forming a first gate electrode structure of a first transistor and a second gate electrode structure of a second transistor, each of said first and second gate electrode structures comprising a placeholder material formed above a gate dielectric layer comprising high-k dielectric material, said first gate electrode structure further comprising a first dielectric cap layer having a first thickness formed above said placeholder material, and said second gate electrode structure further comprising a second dielectric cap layer having a second thickness formed above said placeholder material, wherein said first thickness is less than said second thickness;
forming a stressed material layer above said first and second transistors, wherein a first portion of said stressed material layer covers said first dielectric cap layer and a second portion of said stressed material layer covers said second dielectric cap layer;
forming a sacrificial mask material above said stressed material layer and laterally adjacent to said first and second gate electrode structures, wherein after forming said sacrificial mask material said first and second portions of said stressed material layer are exposed for further processing and an upper surface of said sacrificial mask material is at a height level that is below a height level of an upper surface of each of said first and second dielectric cap layers;
removing said first and second portions of said stressed material layer and said first and second dielectric cap layers in the presence of said sacrificial mask material during a common etch process while leaving a remaining portion of said stressed material layer above said first and second transistors;
removing an entirety of said sacrificial mask material;
after removing said entirety of said sacrificial mask material, forming a protective material laterally adjacent to and above each of said first and second gate electrode structures and in contact with said placeholder material of each of said first and second gate electrode structures;
removing a portion of said protective material by performing an etch process so as to expose a surface of said placeholder material; and
removing said placeholder material from each of said first and second gate electrode structures.

16. The method of claim 15, further comprising removing said sacrificial mask material, wherein removing said first and second dielectric cap layers and removing said sacrificial mask material are performed as an in situ process.

17. The method of claim 15, wherein forming said protective material comprises forming a dielectric material and using a portion of said dielectric material as an interlayer dielectric material.

18. The method of claim 15, further comprising removing said protective material after removing said placeholder material from each of said first and second gate electrode structures.

19. The method of claim 15, further comprising forming a metal-containing electrode material in each of said first and second gate electrode structures after removing said placeholder material from each of said first and second gate electrode structures.

20. The method of claim 15, wherein a conductivity type of said first transistor is different from a conductivity type of said second transistor.

21. The method of claim 15, further comprising, prior to forming said stressed material layer above said first and second transistors, forming a first sidewall spacer adjacent to sidewalls of said first gate electrode structure and a second sidewall spacer adjacent to sidewalls of said second gate electrode structure, wherein an upper portion of said first sidewall spacer covers sidewalls of said first dielectric cap layer and an upper portion of said second sidewall spacer covers sidewalls of said second dielectric cap, wherein said upper portions of said first and second sidewall spacers separate said respective first and second portions of said stressed material layer from said sidewalls of said respective first and second dielectric cap layers, and wherein said upper portions of said respective first and second sidewalls spacers are removed during said common etch process.

* * * * *